(12) United States Patent
Yu et al.

(10) Patent No.: US 6,404,373 B1
(45) Date of Patent: Jun. 11, 2002

(54) COMPARATOR CIRCUIT FOR ANALOG-TO-DIGITAL CONVERTER

(75) Inventors: Chu-Chiao Yu; Her-Y Shih; Jinn-Ann Kuo, all of Hsin-Chu (TW)

(73) Assignee: Topic Semiconductor Corp., Hsin-Chu (TW)

( * ) Notice: Subject to any disclaimer, the term of this patent is extended or adjusted under 35 U.S.C. 154(b) by 0 days.

(21) Appl. No.: 09/689,673

(22) Filed: Oct. 13, 2000

(51) Int. Cl.$^7$ ................................................ H03M 1/36
(52) U.S. Cl. ........................................ 341/155; 341/159
(58) Field of Search ................................. 341/156–159

(56) References Cited

U.S. PATENT DOCUMENTS 5,157,397 A  * 10/1992  Vernon ........................ 341/159
5,291,198 A  *  3/1994  Dingwall et al. ............ 341/159

* cited by examiner

Primary Examiner—Howard L. Williams
(74) Attorney, Agent, or Firm—Bacon & Thomas

(57) ABSTRACT

A comparator circuit used in an analog-to-digital converter includes an input voltage signal line; a reference voltage signal line; a plurality of comparators connected to said input voltage signal line and said reference voltage signal line; a plurality of amplifiers corresponding separately to each of said plurality of comparators and connected respectively between said input voltage signal lines, said reference voltage signal lines, and their corresponding comparators; and a thermocode channel connected to outputs of said plurality of comparators. A plurality of resistors with resistances in a constant ratio are provided in said reference voltage signal line and each is connected between the inputs of two adjacent amplifiers. A plurality of averaging resistors are provided and each is connected between the drains of the input transistor of two adjacent comparators; wherein said plurality of averaging resistors have the same resistance.

3 Claims, 6 Drawing Sheets

COMPARATOR CIRCUIT FOR ANALOG-TO-DIGITAL CONVERTER

FIELD OF INVENTION

The present invention relates to a comparator circuit for analog-to-digital converter, especially to a comparator circuit with equalization effects that can be used in an analog-to-digital converter.

BACKGROUND OF INVENTION

The analog-to-digital converter (ADC) is a useful circuit in the application of signal processing. An ADC is used to convert analog signals into digital signals. Most frequently used ADC's include flash ADC, interpolative ADC, folding ADC, two stage ADC etc.

FIG. 1 shows the circuit diagram of a conventional flash ADC. As shown in this figure, a conventional ADC comprises a thermocode to binary signal decoder 10 that converts input signals into binary codes according to thermocodes generated by a comparator circuit to be described in details hereinafter. The thermocodes are generated as the result of comparing the voltages of the input signals with reference voltages in a series of comparators 24a, 24b, 24c and 24d. The reference voltages in the comparators 24a, 24b, 24c and 24d are in a constant ratio. For example, the reference voltage of comparator 24a may be greater than that of comparator 24b for an LSB (a least significant bit, i.e., the smallest resolvable voltage of the ADC). And so on.

In order to compare the voltage of the input signals with the reference voltages, the input signal Vin is input from an input line 22 and is forwarded to all comparators. A reference voltage Vref is input from a reference signal line 20 and is regulated by resistors 18a, 18b, 18c and 18d, such that reference voltages in the comparators are in a predetermined ratio. The operation of the comparator circuit is well known to those skilled in the art and detailed description thereof is thus omitted.

In order to enhance the accuracy of the comparator circuit, preamplifiers 14a, 14b, 14c and 14d are provided at the upstream position to comparators 24a, 24b, 24c and 24d, respectively. The function of the preamplifiers 14a, 14b, 14c and 14d is to amplify the input signals and the reference voltages, such that the small differences between the voltages of input signals and the reference voltages may be amplified. In such a circuit, the input signals Vin and the reference voltage Vref are first input to the preamplifiers 14a, 14b, 14c and 14d and are then forwarded to comparators 24a, 24b, 24c and 24d. After the voltage of an input signal is compared with the reference voltages, a thermocode representing the result of the comparison is generated. In this circuit, the offset voltage of the comparators and the preamplifiers may bring a decisive influence to the accuracy of the comparator circuit.

Take the CMOS flash ADC as an example. If the requirement for its resolution is 10 bits, 1,024 comparators will be needed in the comparator circuit. When the input voltage of the circuit is 2V, the offset voltage of every comparator shall be smaller than 1 mV (½ LSB). However, in an ordinary CMOS comparator, its offset voltage can be tens of mV. Even if preamplifiers are positioned in front of the comparators, the reaction speed of the total circuit will be damaged due to the high gain values of the preamplifiers. Although it is possible to enlarge the dimension of the transistors at the input of the amplifiers to reduce the offsets of the preamplifier brought by errors existing in the manufacture process, the total space occupied by the circuit will become too large for an ADC and the over loading of capacitance in the preamplifiers will damage the operation speed of the circuit. In addition, the offsets in the preamplifiers themselves will damage the accuracy of other components of the comparator circuit.

In the conventional art, the above-said problems may be solved by using an averaging circuit. FIG. 2 shows an analog-to-digital converter with improved cell mismatch compensation as disclosed in U.S. Pat. No. 5,835,048. In this circuit, a string of resistors are connected to the outputs of the preamplifiers to average the offsets of the preamplifiers. After the averaging, the accuracy of the circuit may be improved, since the offsets of the preamplifiers are reduced.

Another approach to solve the above-said problem is disclosed by U.S. Pat. No. 5,175,505. This invention also used a string of resistors connected to the output of the preamplifiers to average the offsets of the preamplifiers. The major difference between the '048 patent and the '550 patent rest in that the '048 patent used an active load and the '550 patent used a passive load. As a result, in the '550 patent the resistors are used as the load of the preamplifiers and in the '048 patent the transistor with high output resistance is used as load. The '048 patent provided an improvement over the '550 patent, because the smaller the averaging resistance (the resistances connected in the horizontal direction) is, the better the averaging effects, i.e., the smaller the offset voltage, will be. However, when the averaging resistance is reduced, the gains of the preamplifiers will also be reduced. If the averaging effects of the circuit of both patents are the same, i.e., if both have the same averaging resistance, preamplifiers with greater gains will still have greater gains, even if the averaging resistors are added. In other words, when the space used by the resistors is the same, a preamplifier wherein the resistor is used as load will have a smaller gain than that of a preamplifier wherein the current source is used as load. This is the improvement provided by the '048 patent.

Although the above-mentioned inventions are capable of averaging the outputs of the preamplifiers, it inherited drawbacks as well. In these prior arts, when the resistance of the resistors applied to the outputs of the preamplifiers is small, gains of the preamplifiers will not be sufficient to provide their functions. On the other hand, if the resistance of the resistors is raised, the averaging effect of the resistors will be damaged.

Generally speaking, the averaging resistor shall have a resistance of several K Ohms to tens of K Ohms to provide averaging effects. In such a range, the amplifying effect of the preamplifiers may also be maintained. However, the total space occupied by the resistors will become too large to be included in a commercial IC chip.

In addition to that, applying averaging resistors at the outputs of the preamplifiers does not solve the influence brought to the comparator by the offset of the input voltage.

It is thus a need in the industry to provide a novel comparator circuit for an analog-to-digital converter which may effectively reduce the offset of the comparator circuit.

It is also necessary to provide a novel comparator circuit for an analog-to-digital converter in which the offset voltages of the comparator circuit may be averaged.

It is also necessary to provide a novel comparator circuit for an analog-to-digital converter wherein offsets of signals may be effectively reduced without the need of providing additional space for circuits.

OBJECTIVES OF THE INVENTION

The objective of this invention is to provide a novel comparator circuit for an analog-to-digital converter which may effectively reduce the offset of the comparator circuit.

Another objective of this invention is to provide a novel comparator circuit for an analog-to-digital converter in which the offset voltages of the comparator circuit may be averaged.

Another objective of this invention is to provide a novel comparator circuit for an analog-to-digital converter wherein offsets of signals may be effectively reduced without the need of providing additional space for circuits.

SUMMARY OF INVENTION

According to the comparator circuit for analog-to-digital converter of this invention, the comparator circuit may be used in an analog-to-digital converter comprising: an input voltage signal line; a reference voltage signal line; a plurality of comparators connected in parallel to said input voltage signal line and said reference voltage signal line; a plurality of amplifiers corresponding separately to each of said plurality of comparators and connected respectively between said input voltage signal lines, said reference voltage signal lines, and their corresponding comparators; and a thermocode channel connected to outputs of said plurality of comparators in parallel; wherein a plurality of resistors with resistances in a constant ratio are provided in said reference voltage signal line and each resistor is connected between the inputs of two adjacent amplifiers. In said comparator circuit for analog-to-converter, a plurality of averaging resistors are provided and each averaging resistor is connected between the drains of the input transistors of two adjacent comparators; wherein said plurality of averaging resistors may have the same resistance.

DETAILED DESCRIPTION OF THE INVENTION

Figure 3:
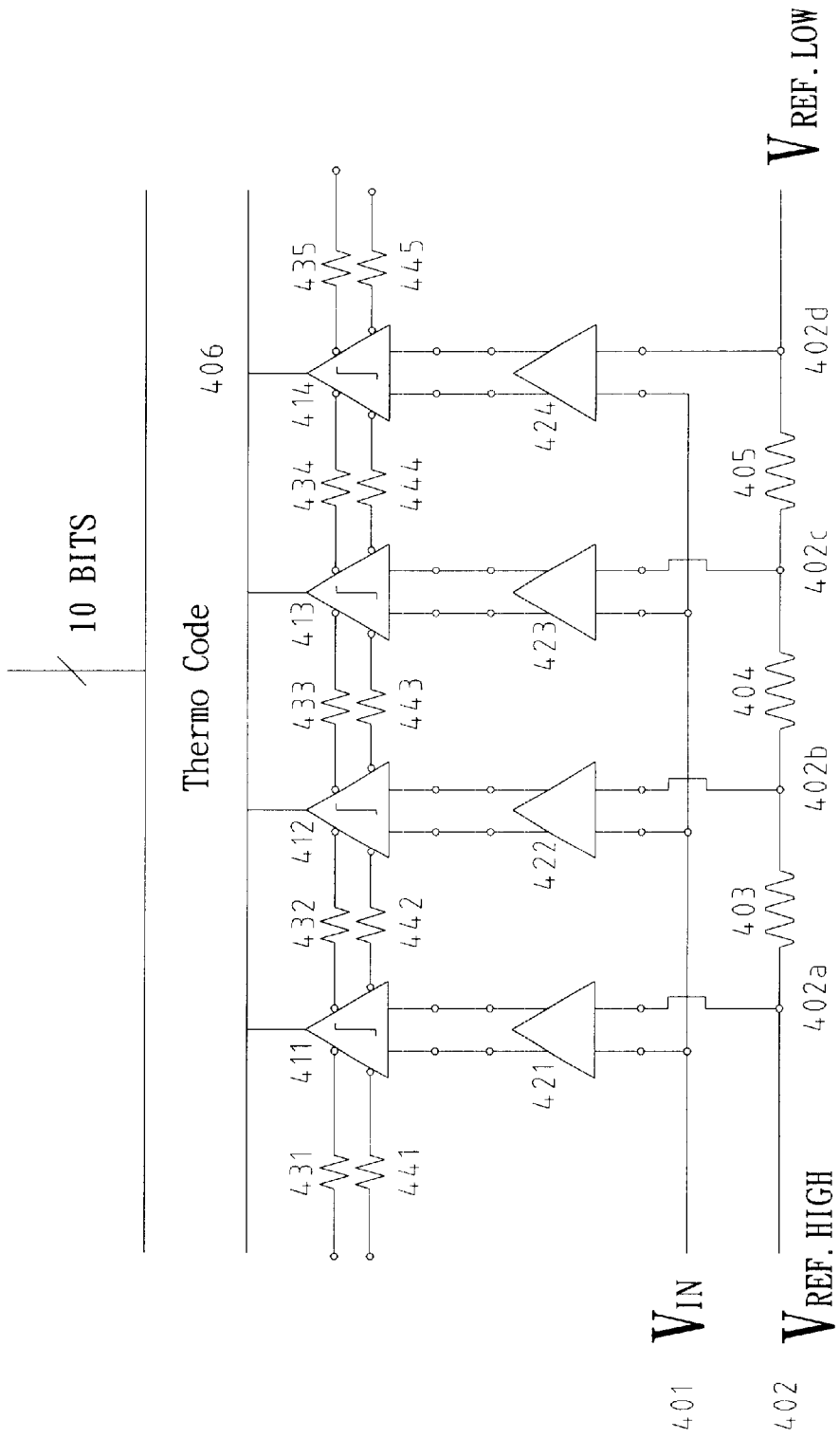
FIG. 3 illustrates the circuit diagram of the comparator circuit for analog-to-digital converter of this invention.

FIG. 3 shows the circuit diagram of the comparator circuit for analog-to-digital converter of this invention. As shown in this figure, the comparator circuit of this invention is used in an analog-to-digital converter comprising: an input voltage signal line 401 to input a voltage Vin to be compared in the comparator; a reference voltage signal line 402 to input a reference voltage Vref; a plurality of amplifiers 421, 422, 423, 424, . . . , with their respective inputs connected to said input voltage signal line 401 and said reference voltage signal line 402, separately; a plurality of resistors 403, 404, 405, . . . , connected in series in said reference voltage signal line 402 wherein resistances of said resistors 403, 404, 405, . . . are in a constant ratio and each resistor is provided between connections 402a, 402b, 402c, . . . , of said reference voltage signal line 402 and each of said amplifiers 421, 422, 423, 424, . . . ; a plurality of comparators 411, 412, 413, 414, . . . , each connected to respective outputs of said plurality of amplifiers 421, 422, 423, 424, . . . , to compare input voltage and reference voltage being amplified respectively by said amplifiers 421, 422, 423, 424, . . . and to output thermocodes representing results of said comparison; a first group of averaging resistors 431, 432, 433, 434, 435, . . . and a second group of averaging resistors 441, 442, 443, 444, 445, . . . ; wherein each averaging resistor is connected to a drain of the input transistor of one comparator and a drain of the input transistor of another comparator; and an output channel to convert thermocodes output by said plurality of comparators 411, 412, 413, 414, . . . into digital codes. In this figure, the output channel outputs 10-bit digital codes.

As a result, the analog-to-digital converter comprises 1,024 comparators and 1,024 amplifiers.

In the operation of the above-said circuit, in one working cycle, the voltage Vin of an analog signal is input from the input signal line 401 and a reference voltage Vref is input from the reference voltage signal line 402. In general applications, the voltage of the analog signal is lower than that of the reference voltage, i.e., 0<Vin<Vref. The reference voltage enters into the inputs of the amplifiers 421, 422, 423, . . . through the resistors 403, 404, 405, . . . At inputs of the amplifiers 421, 422, 423, . . . , the reference voltages are in a constant ratio. In another word, they are 0, $V_{LSB}$, 2 $V_{LSB}$, 3 $V_{LSB}$, . . . , Vref. $V_{LSB}$=Vref/$2^N$, N is the number of bits of the A/D converter.

The input voltage enters into the amplifiers 421, 422, 423, . . . from the input signal line 401. In the amplifiers 421, 422, 423, . . . , the input voltage and the reference voltages are amplified at the same time. Thereafter, they are output to the comparators 411, 412, 413, . . . , in which the input voltage and the reference voltages which have been amplified are compared. The results of the comparison being 0 or 1 are output to the output channel 406 as "thermocodes". The output channel 406 then converts the thermocode that is input to it within a working cycle into a digital code.

Although it is not intended to limit the scope of this invention, according to this invention, averaging resistors connected between the drains of the input transistors of each two comparators may provide averaging effects to the output of the whole converter circuit. As offset voltages may arise in both the preamplifier circuit and the comparator circuit, such offset voltages may be reduced by averaging resistors provided between the drains of each two adjacent comparators.

Figure 4:
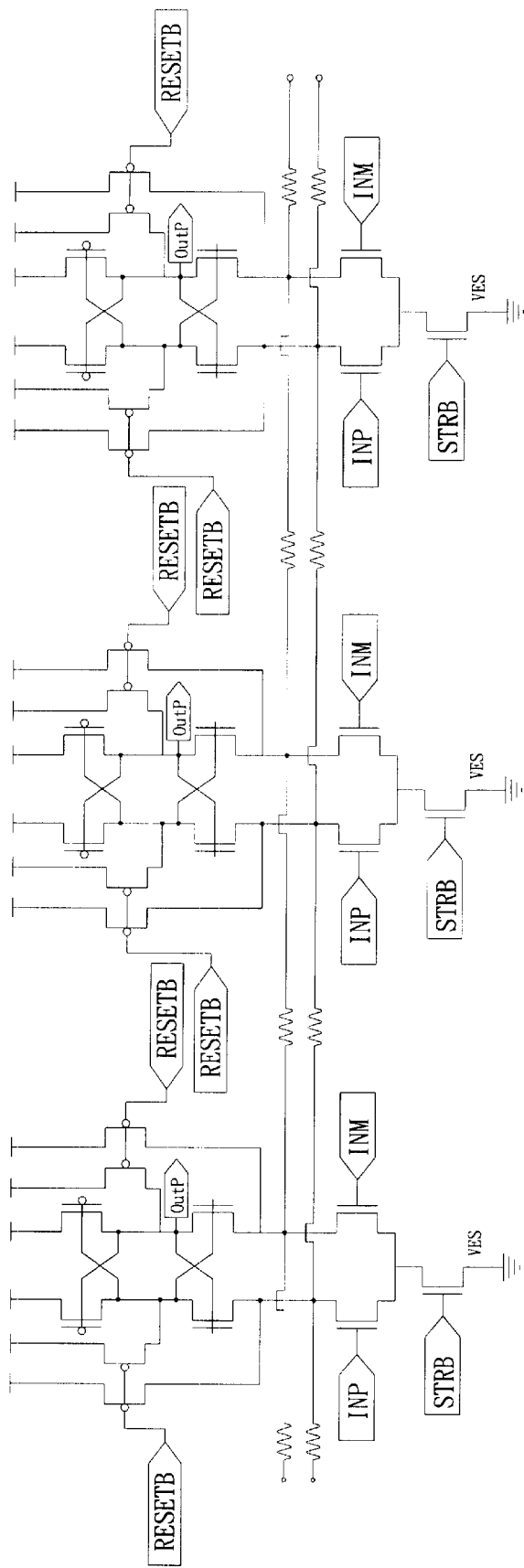
FIG. 4 illustrates a detailed circuit diagram of the comparator circuit for analog-to-digital converter.

FIG. 4 shows a detailed circuit diagram of the comparator for analog-to-digital converter of this invention. In this figure, RESETB represents a reset signal and STRB represents a sampling signal In the circuit of this figure, when RESETB is LOW, output of the comparators will be reset to VDD. When RESETB is HIGH, the comparison is operated.

Figure 1:
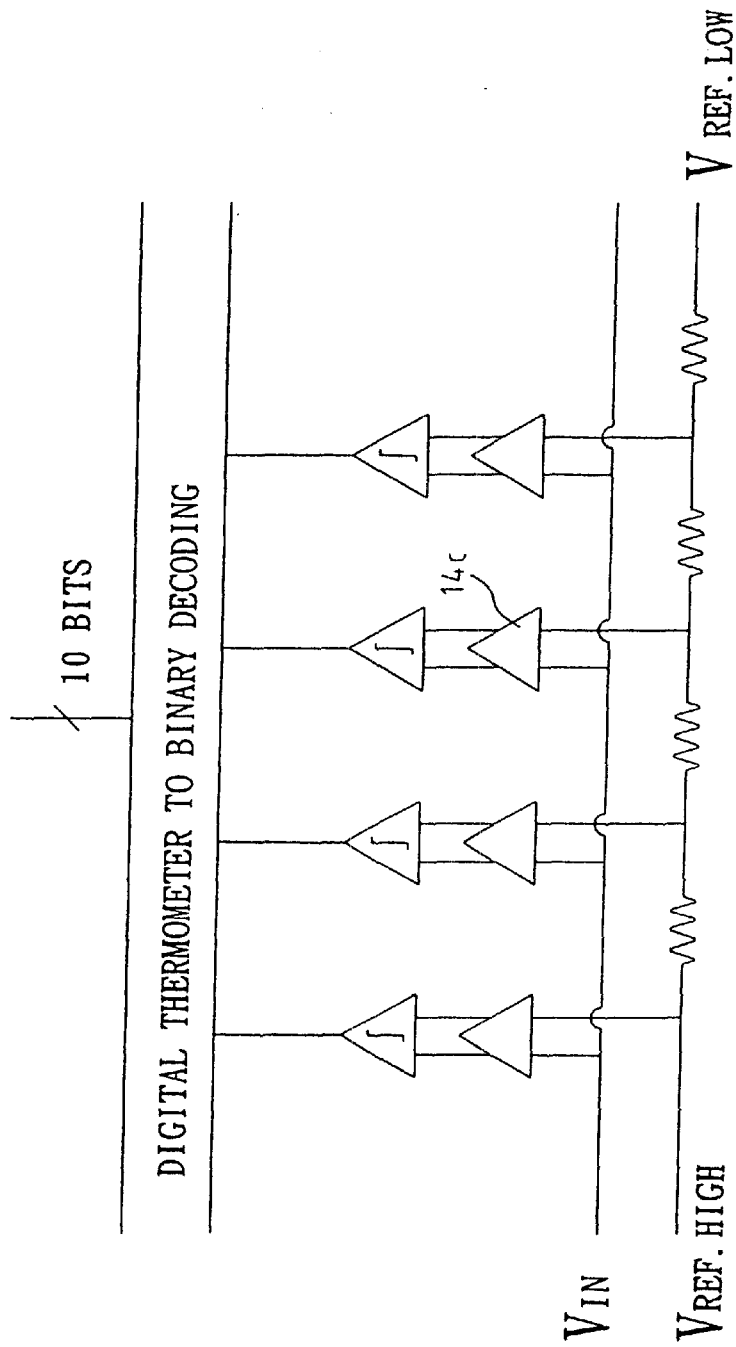
FIG. 1 illustrates the circuit diagram of a conventional comparator circuit for analog-to-digital converter.
Figure 2:
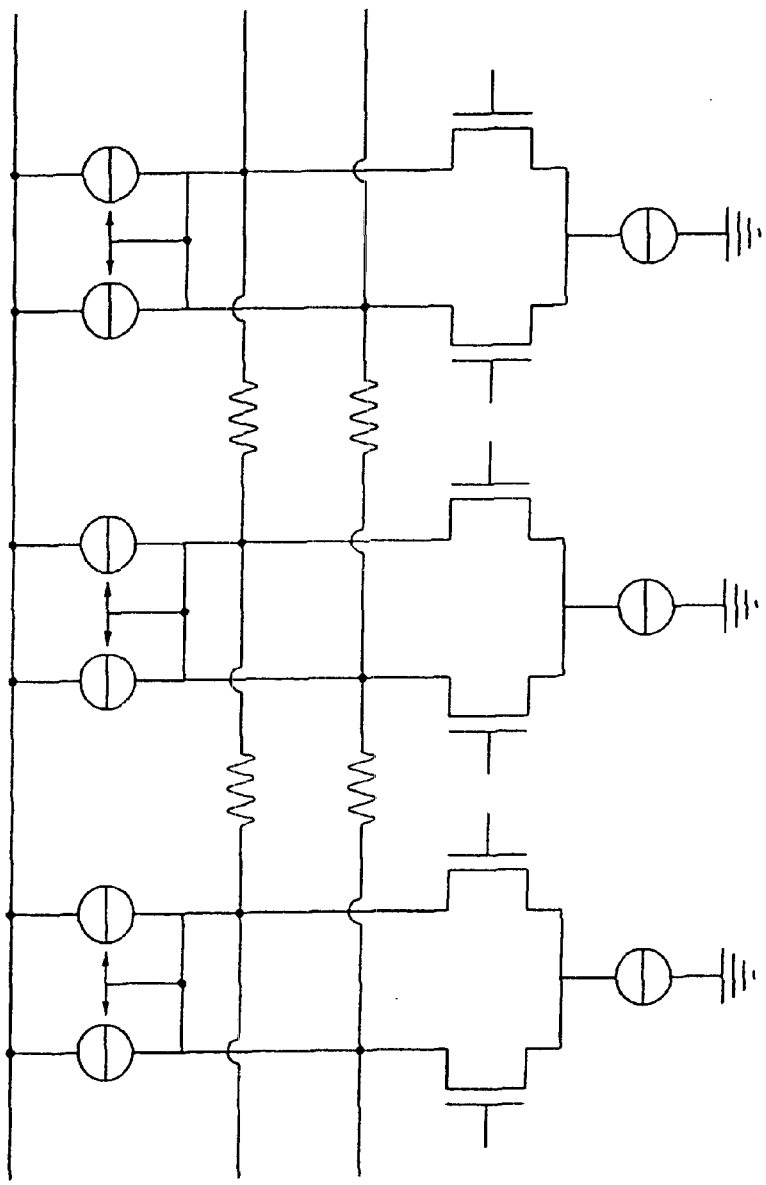
FIG. 2 illustrates the circuit diagram of an improved conventional comparator circuit for analog-to-digital converter.
Figure 5:
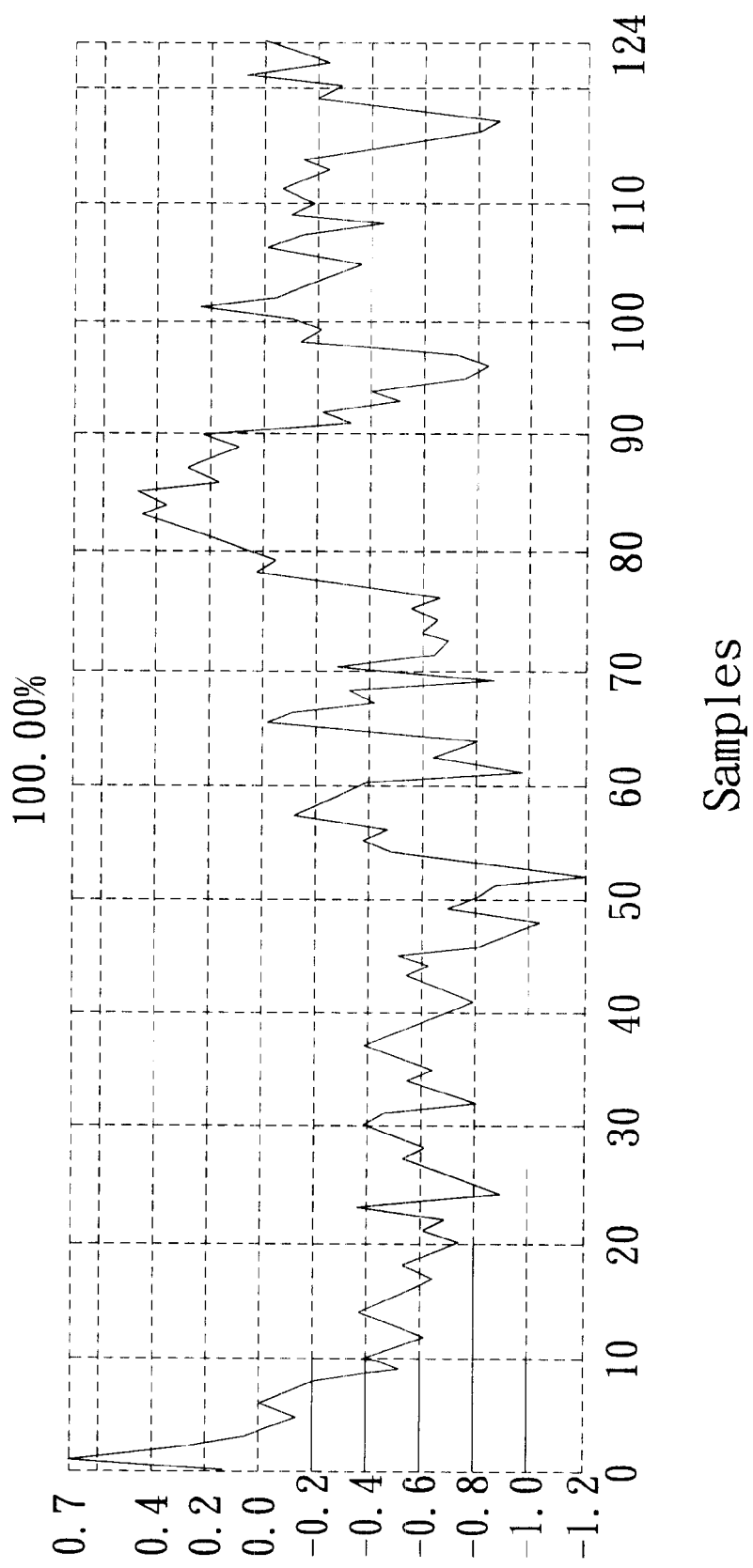
FIG. 5 shows the integral non-linearity of signals converted by a conventional analog-to-digital converter, as simulated in a personal computer.
Figure 6:
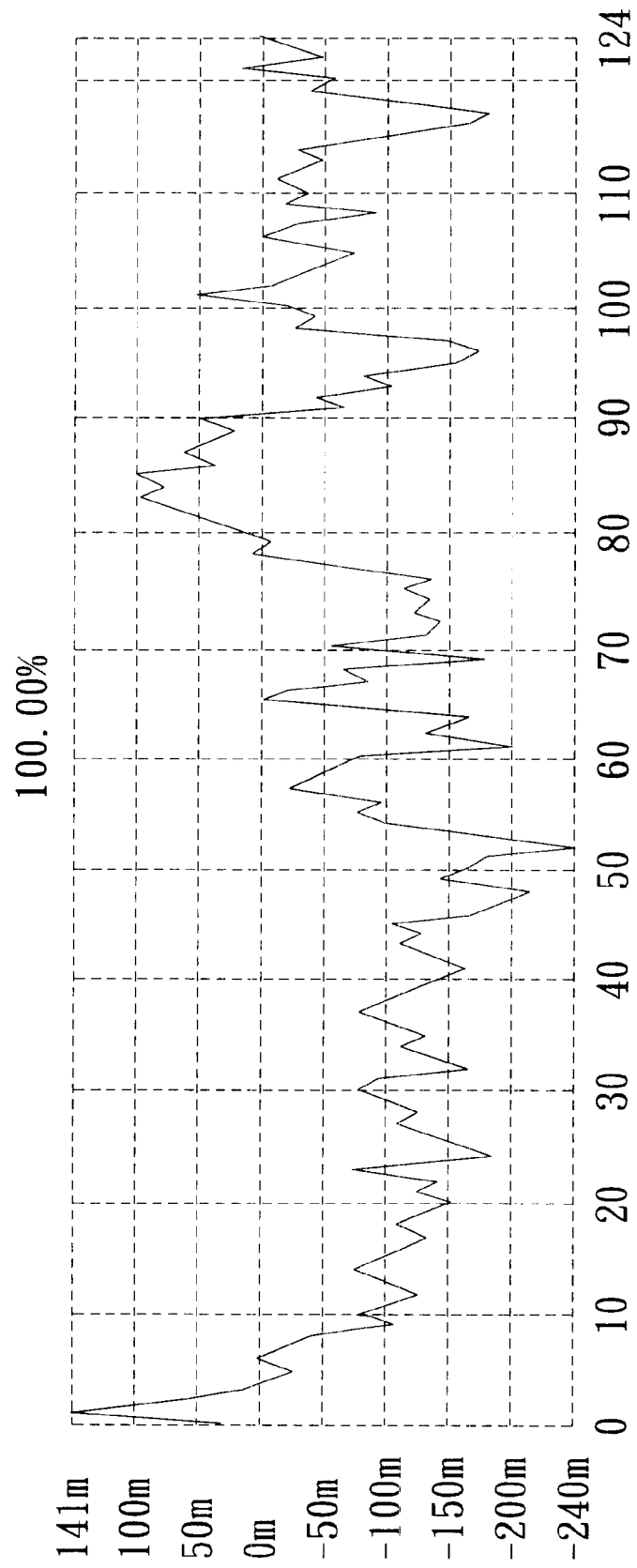
FIG. 6 shows the integral non-linearity of signals converted by the analog-to-digital converter provided with the comparator circuit of this invention, as simulated in a personal computer.

In the embodiment of this invention, the resistance of the averaging resistors may be as low as 100–200 Ohm. This is partly because, not like the amplifier, the comparator does not need to amplify signals. In an amplifier, averaging resistors with low resistance will reduce the gain of the amplifier. This does not happen in a comparator. In addition, the averaging resistors functions only within a short moment when an input signal is compared with the reference voltages in the comparators. Thereafter the positive feedback circuits in the comparators generate outputs of HIGH or LOW according to the polarity of the input signal. As the functional period of the averaging resistors is so short, it does not reduce the speed of the comparators. It is also shown in FIG. 4 that number of components used in the comparator circuit of FIG. 4 is less than that in FIG. 2. As a result, manufacture cost of the comparator may be reduced. Nevertheless, it is not necessary to provide additional space in the circuit to include the comparator circuit of this invention. FIG. 5 and FIG. 6 separately show the integral non-linearity of signals being converted by the A/D converter of FIG. 2 and by the A/D converter of FIG. 4, as simulated in a personal computer. It is obviously shown that the comparator circuit of this invention may improve the resolution of an A/D converter to 2–3 bits.

In the above detailed description of the embodiment of this invention, the analog-to-digital converter is a flash A/D converter. It is however understood that the invented comparator circuit may be used in an interpolation A/D converter, a folding A/D converter, a two-step A/D converter etc.

As the present invention has been shown and described with reference to preferred embodiments thereof, those skilled in the art will recognize that the above and other changes may be made therein without departing from the spirit and scope of the invention.

What is claimed is:

1. An analog-to-digital converter comprising:

an input voltage signal line; a reference voltage signal line; a plurality of comparators connected to said input voltage signal line and said reference voltage signal line; a plurality of amplifiers corresponding to said plurality of comparators and connected respectively between said input voltage signal line, said reference voltage signal line, and their corresponding comparators; and a thermocode channel connected to outputs of said plurality of comparators; wherein a plurality of resistors are provided in said reference voltage signal line, between connections of said reference voltage signal and two adjacent amplifiers; and wherein each of said plurality of comparators comprises an input transistor;

characterized in that said analog-to-digital converter further comprises a plurality of averaging resistors, each connects drains of said input transistor of two adjacent comparators.

2. The analog-to-digital converter according to claim 1 wherein resistances of said plurality of resistors provided in said reference voltage signal line are in a constant ratio.

3. The analog-to digital converter according to claim 1 or 2 wherein said averaging resistors have the same resistance.

* * * * *